(12) United States Patent
Hanya

(10) Patent No.: US 10,932,373 B2
(45) Date of Patent: Feb. 23, 2021

(54) CIRCUIT BOARD, ELECTRONIC CIRCUIT DEVICE, AND PRODUCTION METHOD OF CIRCUIT BOARD

(71) Applicant: STANLEY ELECTRIC CO., LTD., Tokyo (JP)

(72) Inventor: Akihiko Hanya, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/296,547

(22) Filed: Mar. 8, 2019

(65) Prior Publication Data
US 2019/0281705 A1  Sep. 12, 2019

(30) Foreign Application Priority Data

Mar. 8, 2018 (JP) .............................. JP2018-042331

(51) Int. Cl.
*H05K 3/40* (2006.01)
*H05K 1/09* (2006.01)
(Continued)

(52) U.S. Cl.
CPC .............. *H05K 3/4069* (2013.01); *H05K 1/09* (2013.01); *H05K 1/097* (2013.01); *H05K 1/116* (2013.01);
(Continued)

(58) Field of Classification Search
CPC .. H05K 3/1216; H05K 3/1283; H05K 3/4038; H05K 3/4061; H05K 3/4064;
(Continued)

(56) References Cited

U.S. PATENT DOCUMENTS 8,063,315 B2 * 11/2011 Das ...................... H05K 3/4053
174/262
8,348,134 B2 * 1/2013 Komatsu ................. H01L 24/29
228/56.3
(Continued)

FOREIGN PATENT DOCUMENTS

JP           4012022 B2    9/2002
JP         2004-103739    *  4/2004
(Continued)

OTHER PUBLICATIONS

Extended European Search Report (EESR) dated Aug. 5, 2019 issued in European Application No. 19161025.2.

*Primary Examiner* — Carl J Arbes
(74) *Attorney, Agent, or Firm* — Holtz, Holtz & Volek PC

(57) ABSTRACT

Provided is a circuit board for reducing a likelihood of so-called through-hole disconnection, and enhancing connection reliability on both sides of a substrate via a through-hole. The circuit board has a substrate with the through-hole, a first conductive part covering an opening of the through-hole on one surface of the substrate in a manner blocking the opening, having a portion inserted into the through-hole from the one surface, and a second conductive part covering a second opening of the through-hole on the other surface of the substrate in a manner blocking the second opening, having a portion inserted into the through-hole from the other surface. The portion of the first conductive part inserted in the through-hole has a columnar shape forming a columnar portion having a diameter smaller than the through-hole. The portion of the second conductive part inserted in the through-hole has a shape that fills a gap between the columnar portion of the first conductive part
(Continued)

and an inner surface of the through-hole. Both of the first and the second conductive parts comprise conductive particles being sintered.

18 Claims, 6 Drawing Sheets

(51) Int. Cl.
*H05K 1/11* (2006.01)
*H05K 3/12* (2006.01)
*H05K 1/03* (2006.01)

(52) U.S. Cl.
CPC ............ *H05K 1/118* (2013.01); *H05K 3/1283* (2013.01); *H05K 3/4061* (2013.01); *H05K 1/0393* (2013.01); *H05K 3/1216* (2013.01); *H05K 2201/0257* (2013.01); *H05K 2201/0266* (2013.01); *H05K 2201/0272* (2013.01); *H05K 2201/09563* (2013.01); *H05K 2203/107* (2013.01); *H05K 2203/1131* (2013.01); *H05K 2203/1476* (2013.01); *H05K 2203/1484* (2013.01)

(58) Field of Classification Search
CPC ......... H05K 3/4069; H05K 2201/0257; H05K 2201/0266; H05K 2201/0272; H05K 2201/09563; H05K 2203/1131; H05K 2203/1476; H05K 2203/1484; H05K 1/0393; H05K 1/09; H05K 1/097; H05K 1/116; H05K 1/118
See application file for complete search history.

(56) References Cited

U.S. PATENT DOCUMENTS

| | | | |
|---|---|---|---|
| 2006/0286301 A1* | 12/2006 | Murata | ............... B32B 15/08 |
| | | | 427/372.2 |
| 2009/0274834 A1 | 11/2009 | Chopra et al. | |
| 2017/0238425 A1 | 8/2017 | Mathews et al. | |
| 2018/0158580 A1 | 6/2018 | Hanya | |

FOREIGN PATENT DOCUMENTS

| | | | |
|---|---|---|---|
| JP | 3900248 B | * | 4/2007 |
| WO | 2016170900 A1 | | 10/2016 |
| WO | 2016170902 A1 | | 10/2016 |

* cited by examiner

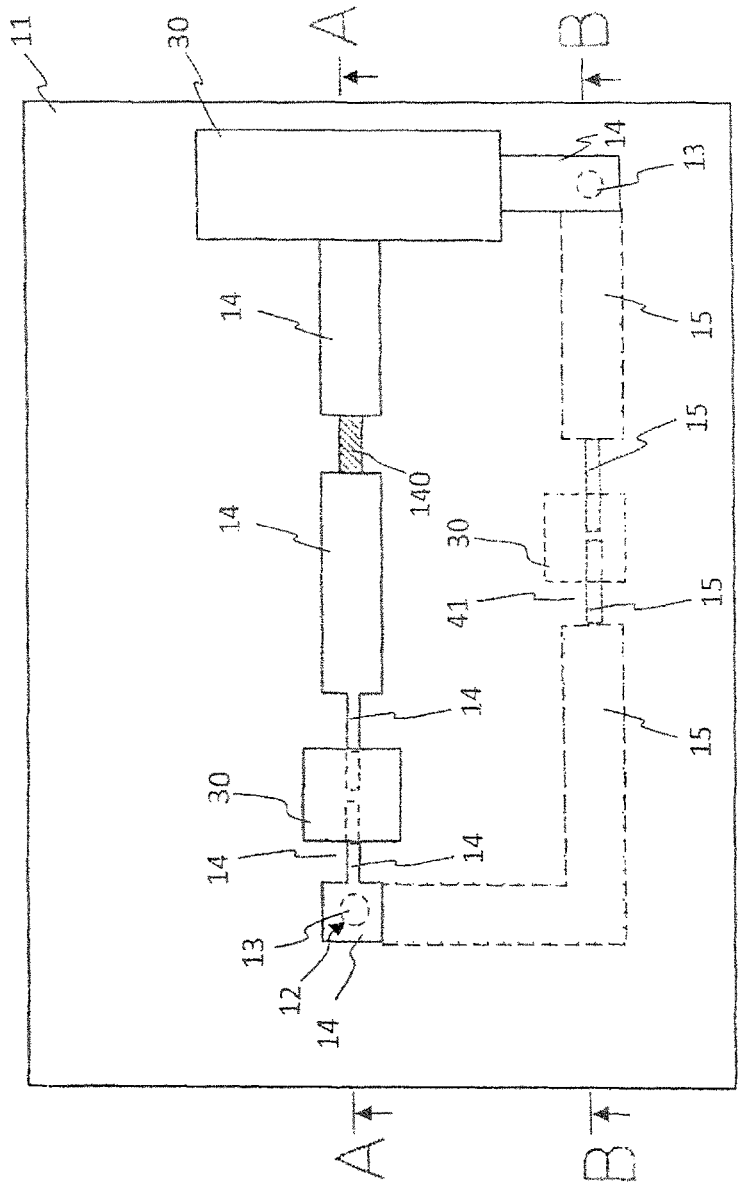
FIG. 6A
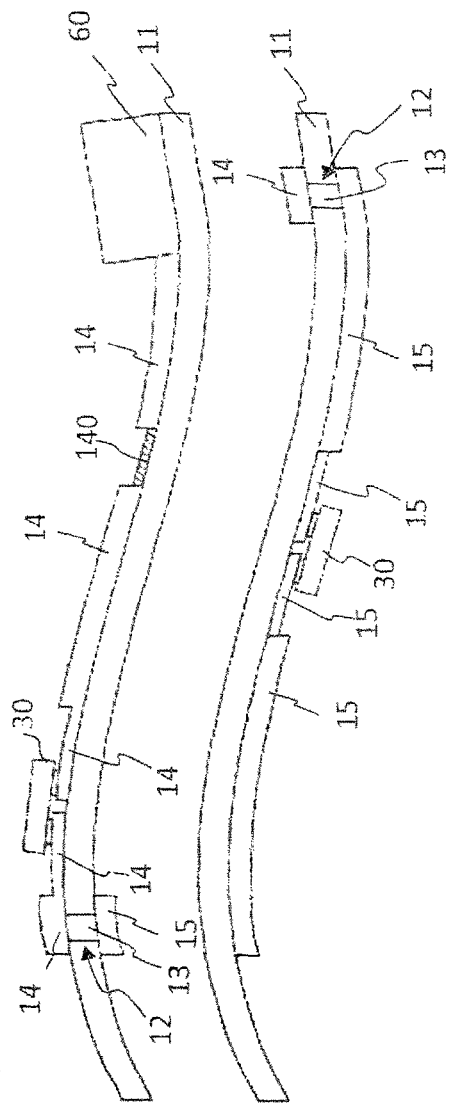
FIG. 6B
A-A CROSS SECTION
FIG. 6C
B-B CROSS SECTION

CIRCUIT BOARD, ELECTRONIC CIRCUIT DEVICE, AND PRODUCTION METHOD OF CIRCUIT BOARD

FIELD OF THE INVENTION

The present invention relates to a circuit board provided with a through-hole that establishes electrical connection between wiring patterns formed respectively on both sides of a substrate.

DESCRIPTION OF THE RELATED ART

There is known a conventional circuit board provided with a through-hole of an insulating substrate, where the through-hole is filled with a conductive material for electrically connecting a frontside and a backside of the substrate.

FIGS. 7 and 8 show examples of such circuit board as described above, and the through-hole 101 of the substrate 100 on which a copper foil 102 is formed as a wiring pattern is filled with conductive resin 103, then heated and cured, whereby the frontside and the backside of the substrate are electrically connected.

In the circuit board disclosed by the Japanese patent No. 4012022 (hereinafter, referred to as "patent document 1"), the through-hole is filled with a conductive resin paste, then conductive particles therein are sintered to induce fusion, and a first conductive part is formed. Contraction of the first conductive part upon sintering generates a cavity in the center of the through-hole, and this cavity is embedded with another conductive resin paste to form a second conductive part where the conductive particles are resin-bonded. Accordingly, the first conductive part comprising the fusion-bonded conductive particles is provided along the inner surface of the through-hole, and the second conductive part where the conductive particles are resin-bonded fills the cavity in the center of the first conductive part.

In the circuit board as shown in the aforementioned FIGS. 7 and 8, or in the circuit board as disclosed by the patent document 1, so-called through-hole disconnection is likely to occur. In other words, in the circuit board as shown in the aforementioned FIGS. 7 and 8, the area of joint between the conductive resins filled in the through-hole and the copper foil is small (joint parts are indicated by broken-line circles in FIGS. 7 and 8). Therefore, when tension is applied to the through-hole and in proximity thereof, due to expansion and contraction of the substrate or a bend therein, thermal shock or environmental testing, and so on, cracking may occur on the joint part between the wiring pattern and conductive materials, causing the likelihood of through-hole disconnection. As for the circuit board described in the patent document 1, there exist in one through-hole, the first conductive part where conductive particles are sintered and the second conductive part where conductive particles are resin-bonded. Accordingly, cracking may occur on the boundaries therebetween, due to thermal shock or a similar event, and this may deteriorate conductivity, resulting in increase of a resistance value. In addition, when a diameter of the through-hole is large, contraction upon curing the conductive resin paste placed in the center may make a dent on the bottom of the through-hole. Therefore, it is necessary to design the through-hole to have a small diameter.

The present invention has been made in view of the aforementioned situations, and an objective of the present invention is to provide a circuit board with a through-hole, excellent in conductivity and heat dispersion, along with enhancing connection reliability on both sides of the substrate via the through-hole.

SUMMARY OF THE INVENTION

A circuit board according to an aspect of the present invention includes a substrate with a through-hole, a first conductive part covering an opening of the through-hole on one surface of the substrate in a manner blocking the opening, having a portion inserted into the through-hole from the one surface, and a second conductive part covering a second opening of the through-hole on the other surface of the substrate in a manner blocking the second opening, having a portion inserted into the through-hole from the other surface. The portion of the first conductive part inserted in the through-hole has a columnar shape having a diameter smaller than the through-hole. The portion of the second conductive part inserted in the through-hole has a shape that fills the gap between the columnar portion of the first conductive part and an inner surface of the through-hole. Both of the first and the second conductive parts comprise conductive particles being sintered.

The circuit board thus configured is produced according to a following production method comprising four steps; a first step of filling a through-hole with a first conductive paste, from one surface of the substrate having the through-hole, the first conductive paste obtained by dispersing conductive particles in a solvent, a second step of forming a first conductive part having a portion inserted in the through-hole, the diameter of the portion being smaller than the through-hole, by heating the first conductive paste for contracting the first conductive paste along with sintering the conductive particles therein, a third step of filling a gap between an inner surface of the through-hole and the first conductive part, with a second conductive paste obtained by dispersing conductive particles in a solvent, from the other surface of the substrate, and a fourth step of forming a second conductive part filling the gap between the inner surface of the through-hole and the first conductive part, by heating the second conductive paste for contracting the second conductive paste along with sintering the conductive particles therein.

According to the present invention, the likelihood of so-called through-hole disconnection can be reduced, thereby enhancing connection reliability on both sides of the substrate via the through-hole.

BRIEF DESCRIPTION OF THE DRAWINGS

FIG. 6A is a top view showing a schematic configuration of an electronic circuit device according to a second embodiment of the present invention, and FIGS. 6B and 6C are cross-sectional views thereof;

DESCRIPTION OF THE PREFERRED EMBODIMENTS

Figure 1:
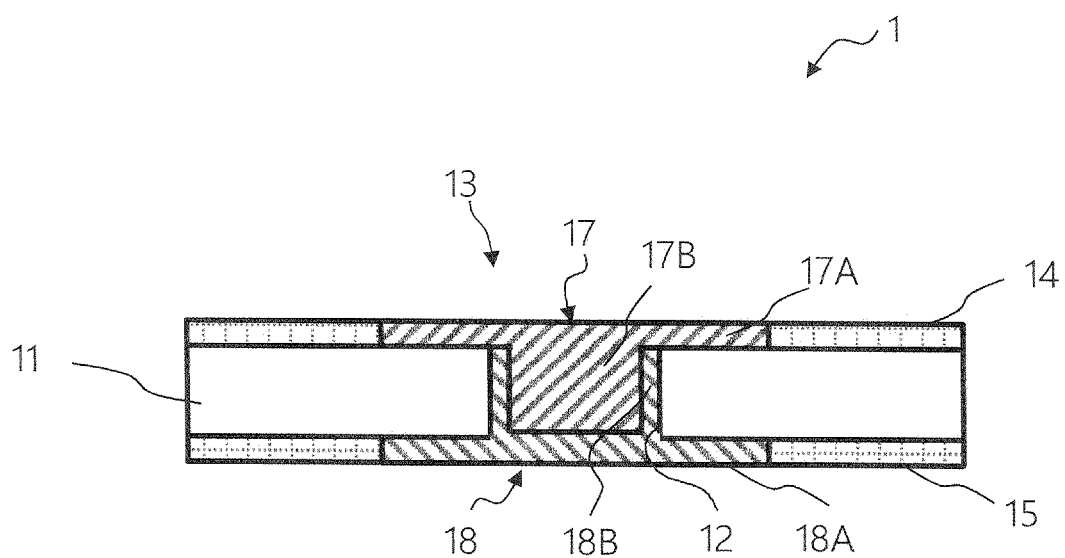
FIG. 1 is a cross-sectional view showing a schematic configuration of a circuit board according to an embodiment of the present invention.

There will now be described an embodiment of the present invention, with reference to accompanying drawings. For ease of understanding and visibility enhancement in the figures described below, hatching is omitted in some cases as appropriate, even in the cross-sectional views. Hereinafter, configurations being identical are labeled with the same reference numeral, and they will not be redundantly explained.

First Embodiment

There will be described a circuit board 1 relating to one embodiment of the present invention.

As shown in FIG. 1, the circuit board 1 of the present embodiment comprises, a substrate 11, a through-hole 12 provided in the substrate, a conductive part 13 filled in the through-hole 12, a frontside wiring pattern 14 provided on the frontside of the substrate 11, and a backside wiring pattern 15 provided on the backside of the substrate 11.

The through-hole 12 is formed through the substrate 11 at a desired position, penetrating the frontside to the backside of the substrate 11.

The conductive part 13 comprises a frontside conductive part 17 (a first conductive part 17) filled in the through-hole 12 and a backside conductive part (a second conductive part 18).

The frontside conductive part 17 (the first conductive part 17) covers the opening of the through-hole on the frontside of the substrate 11 in a manner blocking the opening, further comprising a frontside connection part 17A (a first connection part 17A) connected to the frontside wiring pattern 14, and a columnar part 17B formed continuously from the frontside connection part and provided vertically into the through-hole 12. The diameter of the columnar part 17B is smaller than the inner diameter of the through-hole 12. The frontside conductive part 17 (the first conductive part 17) and the frontside wiring pattern 14 may be formed as a single piece.

The backside conductive part 18 (the second conductive part 18) covers the opening of the through-hole on the backside of the substrate 11 in a manner blocking the opening, further comprising a backside connection part 18A (a second connection part 18A) connected to the backside wiring pattern 15, and a shape 18B (hereinafter, referred to as a concave part 18B) bonded to the columnar part 17B within the through-hole 12 so as to fill the gap between the columnar part 17B and the inner surface of the through-hole 12. The backside conductive part 18 (the second conductive part 18) and the backside wiring pattern 15 may be formed as a single piece.

Both of the frontside conductive part 17 and the backside conductive part 18 comprise conductive particles being sintered.

As described so far, in the present embodiment, within the through-hole, the diameter of the columnar part 17B of the first conductive part 17 is smaller than the inner diameter of the through-hole and the second conductive part 18 has the shape to fill the gap between the inner surface of the through-hole 12 and the columnar part 17B. Therefore, the first conductive part 17 is bonded to the second conductive part 18, on both the circumference and the bottom of the columnar part 17B, and thus the area of joint is large. In addition, both the frontside conductive part 17 and the backside conductive part 18 comprise conductive particles being sintered, and this allows rigid bonding between the boundaries of the first conductive part 17 and the second conductive part 18 when sintering is performed. With this configuration, even when tension is applied to the through-hole and in proximity thereof, due to expansion and contraction of the substrate or a bend therein, thermal shock or environmental testing, and so on, the likelihood of through-hole disconnection and/or increase of resistance can be reduced.

According to the production method as described below, the first conductive part 17 in the center of the through-hole 12 is formed prior to forming the second conductive part 18 that fills the gap around the conductive part 17, whereby the width of the gap to be filled with the second conductive part 18 can be made smaller relative to the diameter of the first conductive part 17. Therefore, contraction of the second conductive part 18 upon sintering can be reduced, whereby gaps generated in the entire conductive part 13 may be minimized with respect to the through-hole 12. Since the contraction of the second conductive part 18 is small, this may avoid deformation such as dents on the bottom of the second conductive part 18, due to the contraction.

Naming of the frontside conductive part 17 and the backside conductive part 18, using the terms "frontside" and "backside", is defined just for the sake of convenience, and the frontside conductive part 17 may be arranged on the lower side, and the backside conductive part 18 may be arranged on the upper side.

It is desirable that neither the first conductive part 17 nor the second conductive part 18 contain resin. The first conductive part 17 may be obtained by sintering conductive nanoparticles having a diameter smaller than 1 μm, or obtained by sintering mixture of the conductive nanoparticles having a diameter smaller than 1 μm and conductive microparticles having a diameter equal to or greater than 1 μm and smaller than 1 mm. The second conductive part 18 may also be obtained by sintering conductive nanoparticles having a diameter smaller than 1 μm, or obtained by sintering mixture of the conductive nanoparticles having a diameter smaller than 1 μm and conductive microparticles having a diameter equal to or greater than 1 μm and smaller than 1 mm. It is to be noted that the diameter of the particle referred to here indicates an average diameter of the particle.

In any of the above cases, an average diameter of the conductive particles of the first conductive part 17 before sintering is preferably equivalent to or smaller than the average diameter of the conductive particles of the second conductive part before sintering, because the smaller is the diameter, the larger contraction is induced when sintering is performed.

Around the through-hole on at least one surface of the substrate 11, there may be mounted wiring pattern 14 or 15, the wiring patter 14 being connected to the first conductive part 17 and the wiring pattern 15 being connected to the second conductive part 18. The wiring patterns 14 and 15 may comprise sintered conductive particles. Furthermore, the substrate 11 may be flexible. Since the wiring patterns 14 and 15 are formed by sintering the conductive particles, making layers be porous, film peeling off or a similar event may hardly occur on the substrate, even though the substrate 11 is flexible.

Next, with reference to FIG. 2, there will be described a method for producing the circuit board 1 that is formed as described above.

Figure 2A:
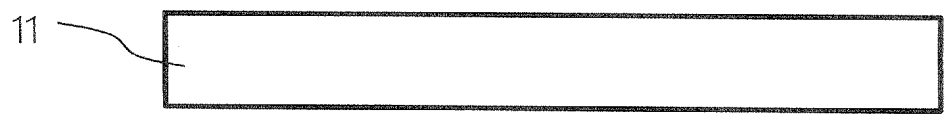
FIGS. 2A to 2F are cross-sectional views showing steps relating to a production method of the circuit board according to an embodiment of the present invention.
Figure 2B:
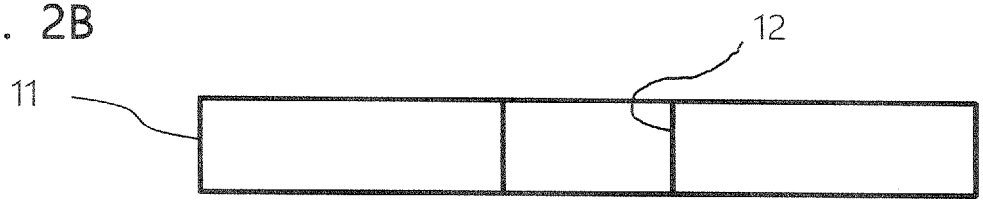

At a predetermined position on the substrate 11 as shown in FIG. 2A, the through-hole 12 is formed passing through the substrate as shown in FIG. 2B, according to any method, for example, stamping, laser processing, and so on.

Figure 2C:
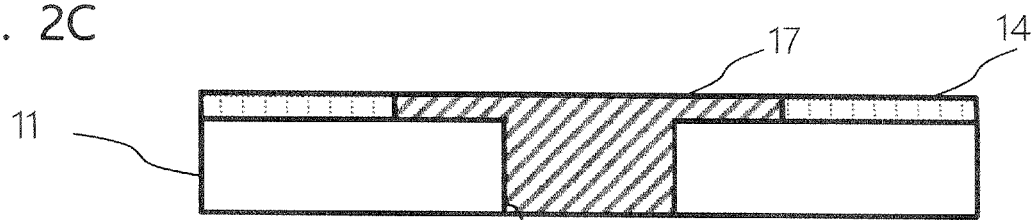

Subsequently, as shown in FIG. 2C, the first conductive paste obtained by dispersing conductive particles in a solvent is prepared, the first conductive paste is applied to a predetermined region in proximity to the edge of the through-hole 12, using a method such as screen printing, from the frontside of the substrate 11, along with filling the through-hole 12.

In the present embodiment, preferably, nanoparticles having a diameter smaller than 1 μm may be employed as the conductive particles for the first conductive paste, so as to cause volume contraction when sintering is performed. However, microparticles having a diameter between or equal to 1 μm and 100 μm may be contained partially. Those microparticles thus contained may reduce the volume contraction, but this may allow sintering of the conductive particles easily with keeping the shape of the first conductive paste, and this facilitates maintaining of the columnar shape. By way of example, the proportion of nanoparticles having a diameter smaller than 1 μm in the conductive particles contained in the first conductive paste, is preferably between or equal to 40 wt % and 100 wt %, more preferably between or equal to 70 wt % and 100 wt %, and much more preferably between or equal to 75 wt % and 100 wt %.

Furthermore, if the proportion of the conductive particles in the first conductive paste is too low, it becomes harder to sinter the conductive particles with keeping the shape of the first conductive paste, and this makes forming of the columnar part 17B more difficult. Therefore, the proportion of the conductive particles in the first conductive paste is preferably between or equal to 50 wt % and 98 wt %, more preferably between or equal to 60 wt % and 95 wt %, and much more preferably between or equal to 80 wt % and 95 wt %.

The conductive paste may contain, in addition to the solvent and the conductive particles, a dispersant such as polyvinylpyrrolidone, resin, and so on. However, it is preferable not to contain the resin (e.g., epoxy resin, silicone resin, and urethane resin), because if any resin remains upon sintering, this may reduce the volume contraction. Since a large amount of dispersant may also reduce the volume contraction, the dispersant should be added in small concentrations to a degree that may not hamper the dispersion.

As for the solvent, too low viscosity of the solvent may cause failure in keeping the shape when filled in the through-hole 12, and thus it is preferable to use the solvent with viscosity that enables keeping of the shape.

Specific examples of the substrate, the conductive particles, and the solvent will be described later.

Simultaneously with filling the through-hole 12b with the first conductive paste, or continuously therefrom, the first conductive paste is applied to the surface of the substrate 11, in the shape of the frontside wiring pattern 14 according to a method such as printing.

Figure 2D:
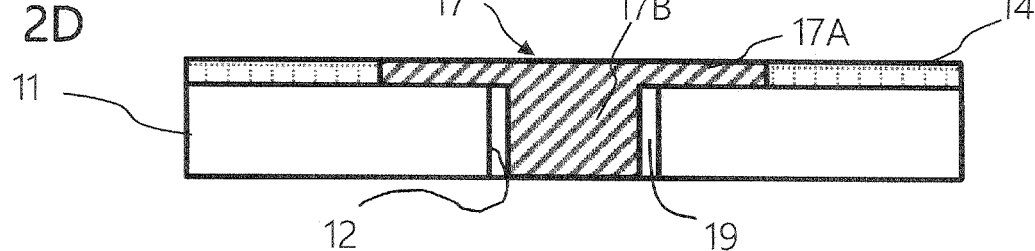

Then, as shown in FIG. 2D, an electromagnetic wave or heat is applied to the first conductive paste, thereby sintering the conductive particles within the conductive paste. A wavelength and other conditions in performing the sintering using the electromagnetic wave will be described later.

With this sintering, the solvent contained in the conductive paste evaporates and the conductive particles are sintered (fused), and then, this causes volume contraction in the conductive paste. Therefore, the conductive paste applied to the proximity of the edge of the through-hole forms the frontside connection part 17A by sintering, and simultaneously, this sintering causes the volume contraction in the conductive paste filled in the through-hole 12 toward the center, separating from the inner surface of the through-hole 12, thereby forming the columnar part 17B. In other words, the conductive paste contracts by sintering, and the frontside conductive part 17 with a T-shaped cross section is formed, comprising the frontside connection part 17A and the columnar part 17B. Then, the gap 19 is generated between the inner surface of the through-hole 12 and the columnar part 17B.

By way of example, the through-hole 12 having a diameter of 300 μm was formed through the substrate 11 having a thickness of 100 μm, the through-hole was filled with the conductive paste where 85 wt % silver particles having an average diameter of 50 nm were dispersed in an organic solvent, and sintering was performed at 160° C. to 200° C. Then, the diameter was contracted approximately by 10%, causing the gap 19.

Furthermore, the first conductive paste in the through-hole 12 is also applied to the surface of the substrate 11, and then sintered to form the frontside wiring pattern 14.

Next, the second conductive paste is prepared to form the second conductive part 18. The proportion of nanoparticles having a diameter smaller than 1 μm in the conductive particles contained in the second conductive paste 18, is preferably between or equal to 0 wt % and 100 wt %, more preferably between or equal to 0 wt % and 90 wt %, and much more preferably between or equal to 0 wt % and 80 wt %.

The proportion of the conductive particles in the second conductive paste is preferably between or equal to 50 wt % and 98 wt %, more preferably between or equal to 60 wt % and 95 wt %, and much more preferably between or equal to 80 wt % and 95 wt %.

Less volume contraction is required in the second conductive paste relative to the volume contraction in the first conductive paste used for the frontside conductive part 17. Therefore, for example, the proportion of conductive microparticles can be higher than the conductive paste used for the frontside conductive part 17.

In the example here, the conductive paste used as the second conductive paste is the same as the first conductive paste.

Figure 2E:
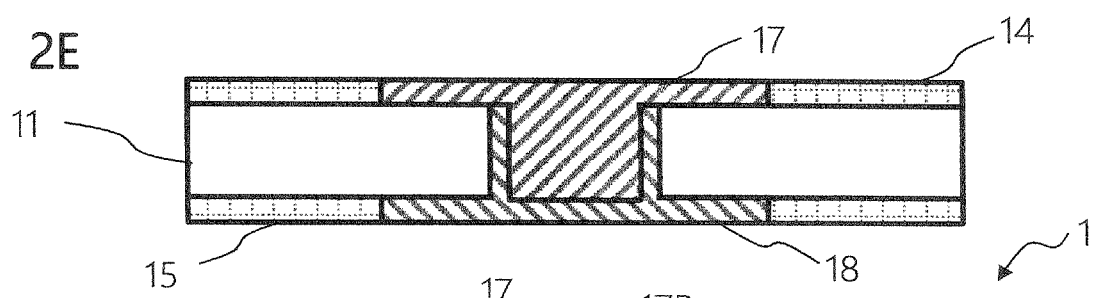

As shown in FIG. 2E, the second conductive paste is applied to a predetermined region in proximity to the edge of the through-hole 12, using a method such as screen printing, from the backside of the substrate 11, along with filling the gap 19 between the inner surface of the through-hole 12 and the columnar part 17B.

As shown in FIG. 2E, simultaneously with or continuously from the previous step, the conductive paste serving as the backside wiring pattern 15 is also applied to the backside of the substrate 11.

Figure 2F:
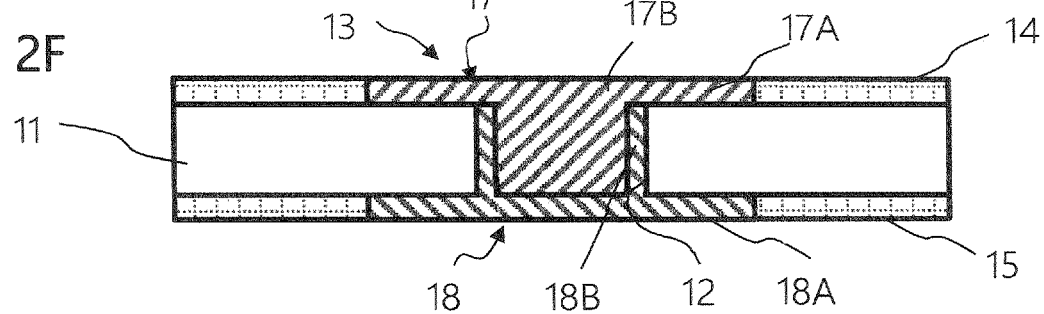

Subsequently, as shown in FIG. 2F, an electromagnetic wave or heat is applied to the second conductive paste, thereby sintering the conductive paste. Then, the conductive paste applied to the proximity of the edge of the through-hole forms the backside connection part 18A, and simultaneously, the conductive paste filled in the gap between the inner surface of the through-hole 12 and the columnar part 17B is sintered to form the concave part 18B. Volume contraction occurs in the concave part 18B toward the center of the through-hole 12, whereby the concave part is rigidly bonded to the columnar part 17B. In other words, the conductive paste contracts by sintering, and the backside conductive part 18 is formed, comprising the backside connection part 18A and the concave part 18B.

Upon heating the second conductive paste within the through-hole 12, heat is conducted also to the first conductive part 17 with which the second conductive paste comes into contact, and the first conductive part 17 is heated for the second time. Therefore, the conductive particles in the first conductive part 17 and the conductive particles in the second conductive paste are sintered together. According to this sintering, the joint surfaces between the first conductive part 17 and the second conductive part 18 are substantially integrated.

According to the process above, there are formed the frontside conductive part 17 and the backside conductive part 18 within the through-hole 12, obtained by sintering the conductive paste.

Furthermore, the second conductive paste applied to the surface of the substrate 11 in the shape of the wiring pattern is also sintered simultaneously with or continuously from heating the second conductive paste within the through-hole, thereby forming the backside wiring pattern 15.

Preferably, a range for applying the conductive paste to form the frontside connection part 17A and the backside connection part 18A should be set appropriately, considering a relationship with other electronic components to be mounted on the substrate 11 and wiring patterns. When a bend or expansion/contraction occurs in the substrate 11, tension is likely to be concentrated on the edge of the through-hole 12. Therefore, it is preferable to determine the application range of the conductive paste to be applied to form the frontside connection part 17A and the backside connection part 18A, in a manner that contact positions respectively between the frontside connection part 17A and the frontside wiring pattern, and between the backside connection part 18A and the backside wiring pattern, should be set to the points less affected by the tension concentrated to the through-hole 12.

As described above, according to the present embodiment, a material with large volume contraction is used as the first conductive paste forming the first conductive part, and thus generated gap is filled with the second conductive paste from the backside and then sintered. Accordingly, the area of joint between the frontside conductive part and the backside conductive part is large, excellent in conductivity and heat dispersion, and therefore, this reduces a likelihood of so-called through-hole disconnection, and connection reliability on both sides of the substrate can be enhanced.

Filling the through-hole with the conductive paste, and application of the conductive paste to form the wiring pattern can be performed simultaneously, thereby reducing the number of production steps. When application of the conductive paste is performed by screen printing, an air vent can be provided easily, and this produces an advantage that facilitates filling of the conductive paste into the entire through-hole.

The wiring pattern may be formed simultaneously with forming the through-hole, or it may be formed prior to or after forming the through-hole.

Any material may be used for the substrate 11, as far as the material is capable of supporting the first and the second conductive parts 17 and 18, and the wiring patterns 14 and 15, at least the surface thereof having insulation properties, and being resistant to sintering when the first and the second conductive parts 17 and 18 are formed. There may be employed, for example, a polyethylene terephthalate (PET) substrate, a polyethylene naphthalate (PEN) substrate, a polycarbonate (PC) substrate, a liquid crystal polymer, a glass epoxy substrate, a paper phenol substrate, a flexible print substrate, a ceramic substrate, a glass containing silicon substrate, a glass substrate, and a metal substrate having a surface coated with an insulating layer. In addition, any flexible material, such as film-like material, may also be used as the substrate 11. As shown in FIG. 6, the substrate 11 may have the curved shape.

As a material of the conductive particle, at least one of the conductive metals such as Ag, Cu, Au, Pt, Ni, and Pd may be employed.

As the solvent where the conductive particles are dispersed, organic solvents, such as amine, alcohol, ether, aromatic compounds, ketone, and nitrile, and water may be employed.

The substrate 11 can be formed with a thickness from about 100 nm to 3 mm. The diameter of the through-hole 12 may be between or equal to 5 μm and 1 mm. Electrical resistivity of the conductive part 13 within the through-hole is preferably $10^{-4}$ Ω·cm or less, and in particular, low resistance in the order of $10^{-6}$ Ω·cm is desirable. The electrical resistivity of the wiring patterns 14 and 15 is preferably $10^{-4}$ Ω·cm or less, and in particular, low resistance in the order of $10^{-6}$ Ω·cm is desirable.

Specifically, at least one of the following methods may be employed for sintering the conductive paste; sintering by irradiation of electromagnetic waves such as light, and sintering according to a method other than the irradiation of electromagnetic waves. When the substrate 11 has optical transparency, any of the upper surface and the lower surface of the substrate 11 may be irradiated with light. When the substrate 11 does not have optical transparency, the substrate is irradiated with light from the upper surface.

When the conductive paste particles are sintered, the conductive particles are melted at a temperature lower than a melting point of bulk material constituting the particles, integrated (fused) with neighboring conductive particles, and then sintered. When the conductive paste particles are sintered by electromagnetic wave irradiation, light or electromagnetic wave being radiated may have any wavelength, such as ultraviolet, visible, and infrared light, but a wavelength absorbable by the conductive particles should be selected for use. When materials such as Ag, Cu, and Au are employed for the conductive particle, the light in the range from 400 to 1064 nm can be used as the electromagnetic wave, for instance. In addition, light beams collected into an irradiation diameter smaller than or equivalent to the through-hole 12 may be employed, preventing a part of the substrate 11 to which the light beams are not applied from being heated. Therefore, even when a resin substrate is used, the substrate 11 is hardly damaged, and transparency of the transparent substrate 11 can be maintained. In addition, by scanning the light beams, the wiring patterns 14 and 15 can also be sintered. If it is no problem to irradiate the substrate with light, the through-hole part and the wiring pattern part are sintered at a time, by irradiating the surface of the substrate entirely with the light.

There has been described an example that the wiring patterns 14 and 15 are formed by sintering the conductive paste, but it is of course possible to employ other methods such as plating and thin-film evaporation to form the wiring pattern.

Modification Example

There will now be described modification examples.

Figure 3:
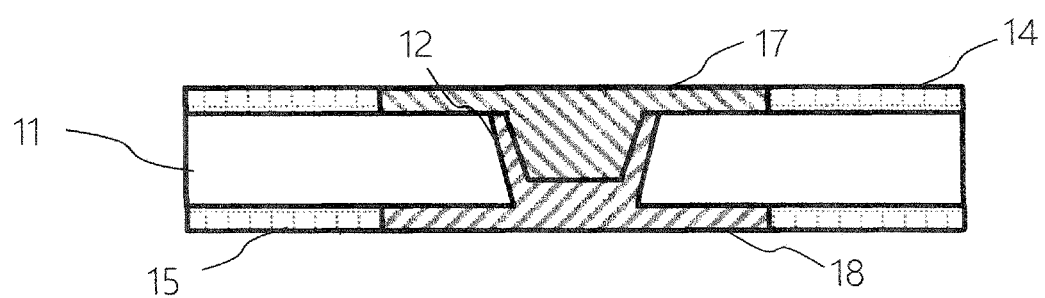
FIG. 3 is a cross-sectional view showing a schematic configuration of the circuit board relating to a modification example of an embodiment of the present invention.
Figure 4:
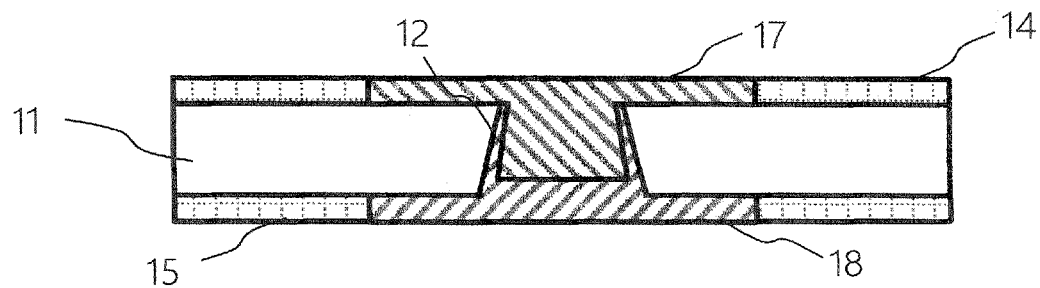
FIG. 4 is a cross-sectional view showing a schematic configuration of the circuit board relating to a modification example of an embodiment of the present invention.

The circuit boards as shown in FIG. 3 and FIG. 4 have the through-hole 12 in tapered shape, formed in the substrate 11. The through-hole 12 passing through the substrate is made with the use of laser or a similar method, whereby this tapered-shape through-hole can be formed.

Figure 5:
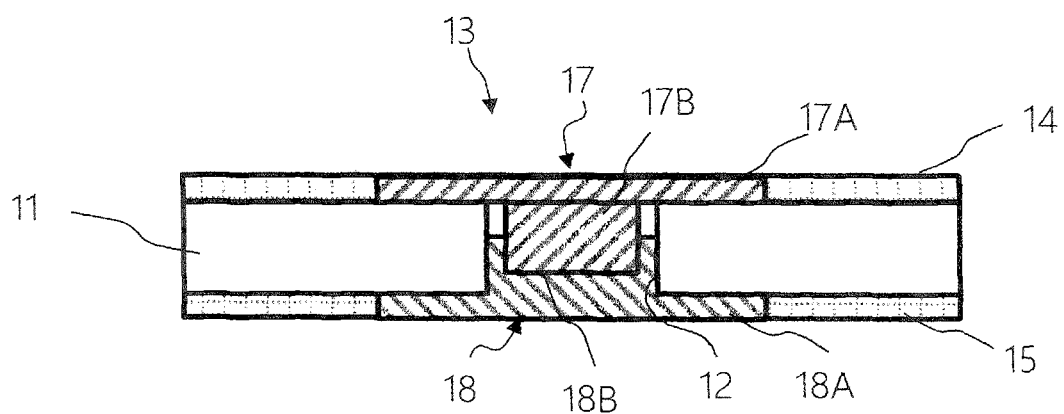
FIG. 5 is a cross-sectional view showing a schematic configuration of the circuit board relating to a modification example of an embodiment of the present invention.
Figure 7A:
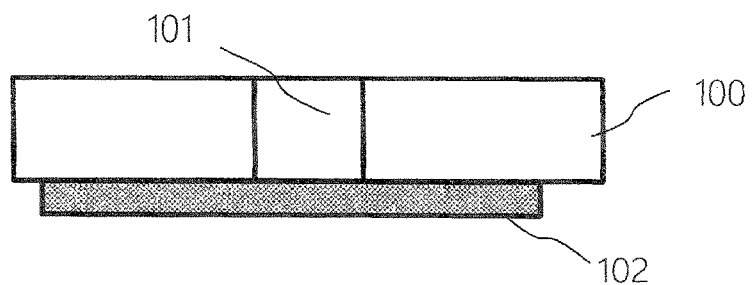
FIGS. 7A and 7B are cross-sectional views showing a schematic configuration of an example of a conventional circuit board.
Figure 7B:
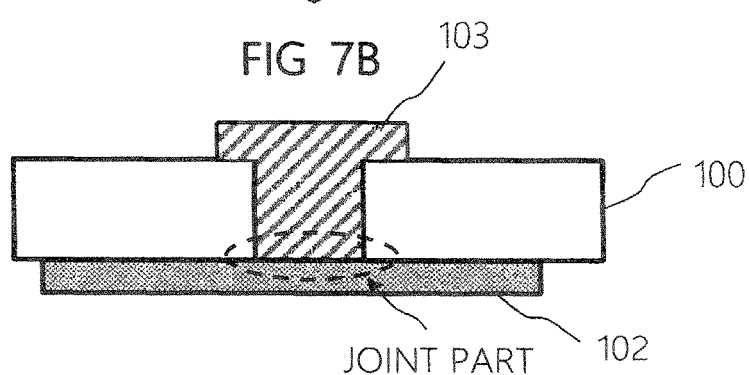
Figure 8A:
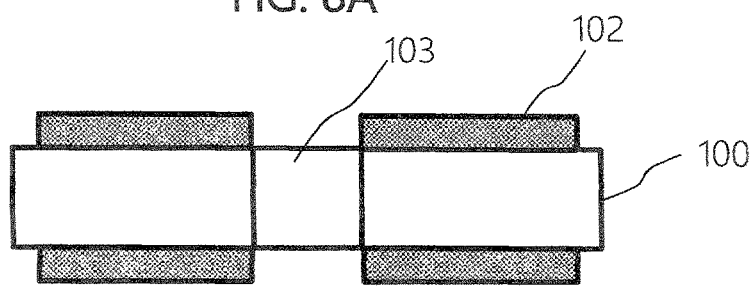
FIGS. 8A and 8B are cross-sectional views showing a schematic configuration of an example of a conventional circuit board.
Figure 8B:
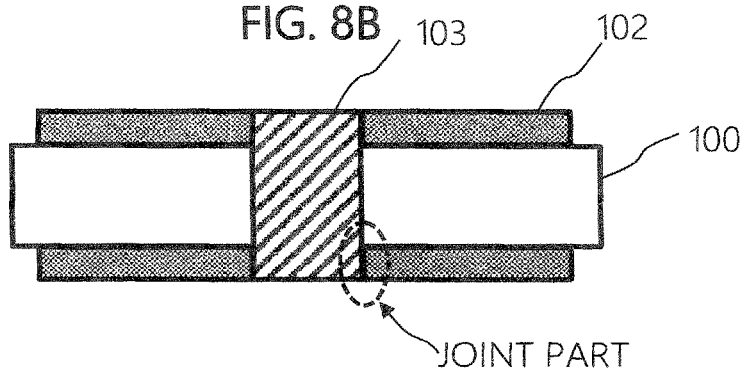

As indicated by the circuit board shown in FIG. 5, the backside conductive part does not necessarily fill the gap generated between the inner surface of the through-hole 12 and the columnar part 17B.

By way of example, even when the backside conductive part fills the gap to a level from a half to a quarter of the thickness of the substrate 11, the area of joint between the frontside conductive part and the backside conductive part can be provided, thus reducing the likelihood of the through-hole disconnection.

In the modification examples, since the configuration and effects of the circuit board other than the description above, which are shown in FIGS. 3 to 5, are the same as the aforementioned embodiment, redundant descriptions will not be provided.

Second Embodiment

With reference to FIGS. 6A to 6C, there will now be described an electronic circuit device configured with the circuit board 1 that relates to the aforementioned embodiment. This electronic circuit device has a configuration where electronic components 30 are mounted on both sides of the circuit board 11. In addition, a resistance 140 is formed on the upper surface of the circuit board 11.

Any element may be used as the electronic component 30, and by way of example, a light emitting element (LED, LD), a light receiving element, an integrated circuit, a display element (such as a liquid crystal display and an EL display), a vehicle-mounted electronic component, or the like, may be employed. The wiring patterns 14 and 15 may be formed in a manner that a plurality of electronic components 30 is connected in a desired circuit pattern, such as in series and in parallel.

The through-hole 12 and the conductive part 13 are provided on the positions allowing both of the wiring patterns to be connected.

A flexible material may be used for the substrate 11, and a transparent material can also be used.

Accordingly, this electronic circuit device may configure a vehicle-use electronic circuit device equipped with vehicle-use electronic components, and may also be applied to electronic devices such as communication equipment, gaming equipment, and OA equipment. By way of example, this electronic circuit device may serve as a device such as an instrument panel of a vehicle, and a monitor of a gaming machine. Since the substrate is allowed to bend, it is applicable to a wearable (body wearable) electronic device (such as glasses, a watch, a display, and medical equipment), and a curved display.

What is claimed is:

1. A method of producing a circuit board, comprising:
   a first step of filling a through-hole, from one surface of a substrate having the through-hole, with a first conductive paste comprising conductive particles dispersed in a solvent;
   a second step of forming a first conductive part having a portion inserted in the through-hole, a diameter of the portion being smaller than a diameter of the through-hole, by heating the first conductive paste to contract the first conductive paste and sinter the conductive particles therein;
   a third step of filling a gap between an inner surface of the through-hole and the first conductive part, with a second conductive paste comprising conductive particles dispersed in a solvent, from the other surface of the substrate; and
   a fourth step of forming a second conductive part filling the gap between the inner surface of the through-hole and the first conductive part, by heating the second conductive paste to contract the second conductive paste and sinter the conductive particles therein,
   wherein in the second step and the fourth step, the first conductive paste and the second conductive paste are heated by irradiation of electromagnetic waves.

2. The method according to claim 1, wherein a proportion of the conductive particles in the first conductive paste is in a range of 50 wt % to 98 wt %, inclusive.

3. The method according to claim 1, wherein a proportion of nanoparticles having a diameter smaller than 1 μm in the conductive particles contained in the first conductive paste is equal to or greater than 40 wt %.

4. The method according to claim 1, wherein an average diameter of the conductive particles contained in the first conductive paste is equal to or smaller than an average diameter of the conductive particles contained in the second conductive paste.

5. The method according to claim 1, wherein in the first step, the first conductive paste is applied to the one surface of the substrate in a shape of a wiring pattern, simultaneously with filling the through-hole with the first conductive paste.

6. The method according to claim 5, wherein in the second step, the first conductive paste in the shape of the wiring pattern is heated, simultaneously with or continuously from heating the first conductive paste within the through-hole.

7. The method according to claim 1, wherein in the third step, the second conductive paste is applied to the other surface of the substrate in a shape of a wiring pattern, simultaneously with filling the through-hole with the second conductive paste.

8. The method according to claim 7, wherein in the fourth step, the second conductive paste in the shape of the wiring pattern is heated, simultaneously with or continuously from heating the second conductive paste within the through-hole.

9. A circuit board produced by the method according to claim 1, the circuit board comprising:
   the substrate with the through-hole;
   the first conductive part, which is formed of the sintered conductive particles of the first conductive paste, covers an opening of the through-hole on the one surface of the substrate in a manner blocking the opening, and has the portion inserted into the through-hole from the one surface; and
   the second conductive part, which is formed of the sintered conductive particles of the second conductive paste, covers a second opening of the through-hole on the other surface of the substrate in a manner blocking the second opening, and has a portion inserted into the through-hole from the other surface,
   wherein:
   the portion of the first conductive part inserted in the through-hole has a columnar shape, and the portion of the second conductive part inserted in the through-hole has a shape that fills the gap between the portion of the first conductive part and the inner surface of the through-hole.

10. The circuit board according to claim 9, wherein neither the first conductive part nor the second conductive part contains resin.

11. The circuit board according to claim 9, wherein the first conductive part is obtained by sintering conductive nanoparticles having a diameter smaller than 1 μm.

12. The circuit board according to claim 9, wherein the first conductive part is obtained by sintering a mixture of conductive nanoparticles having a diameter smaller than 1 μm and conductive microparticles having a diameter equal to or greater than 1 μm and smaller than 1 mm.

13. The circuit board according to claim 11, wherein the second conductive part is obtained by sintering the conductive nanoparticles having the diameter smaller than 1 μm.

14. The circuit board according to claim 12, wherein the second conductive part is obtained by sintering a mixture of the conductive nanoparticles having the diameter smaller than 1 μm and the conductive microparticles having the diameter equal to or greater than 1 μm and smaller than 1 mm.

15. The circuit board according to claim 11, wherein an average diameter of the conductive particles of the first conductive part before sintering is equal to or smaller than an average diameter of the conductive particles of the second conductive part before sintering.

16. The circuit board according to claim 9, further comprising:
a wiring pattern connected to the first conductive part or to the second conductive part, around the through-hole on at least one of the surfaces of the substrate,
wherein the wiring pattern comprises sintered conductive particles.

17. The circuit board according to claim 9, wherein the substrate is flexible.

18. An electronic circuit device comprising:
the circuit board according to claim 9, which is provided with wiring patterns; and
electronic components mounted on at least one side of the circuit board.

* * * * *